United States Patent [19]
Wurcer

[11] Patent Number: 5,124,596
[45] Date of Patent: Jun. 23, 1992

[54] SINGLE-TEMPERATURE-TRIMMABLE FET INPUT CIRCUIT HAVING ACTIVE CHANNEL SEGMENTS OF DIFFERENT AREAS

[75] Inventor: Scott Wurcer, Cambridge, Mass.

[73] Assignee: Analog Devices, Inc., Norwood, Mass.

[21] Appl. No.: 408,674

[22] Filed: Sep. 18, 1989

[51] Int. Cl.⁵ .................. H03K 17/687; H01H 37/76
[52] U.S. Cl. ............................... 307/571; 307/202.1; 307/303.2; 307/572; 357/41; 357/51
[58] Field of Search ............. 307/303.2, 202.1, 450, 307/465, 468–469, 571–572; 352/41, 51

[56] References Cited

U.S. PATENT DOCUMENTS

| | | | |
|---|---|---|---|
| 3,729,660 | 4/1973 | Maidique | 357/28 |
| 4,210,875 | 7/1980 | Beasom | 330/261 |
| 4,306,246 | 12/1981 | Davies et al. | 357/36 |
| 4,885,481 | 12/1989 | Hobbs et al. | 307/202.1 |
| 4,922,134 | 5/1990 | Hoffmann et al. | 307/202.1 |

Primary Examiner—Stanley D. Miller
Assistant Examiner—Margaret Rose Wambach
Attorney, Agent, or Firm—Wolf, Greenfield & Sacks

[57] ABSTRACT

In an FET differential input, preferably using a quad set of devices according to the teaching of U.S. Pat. No. 3,729,660, the channel of each transistor is formed in a piecewise manner, of multiple segments. Each channel segment is associated with a corresponding drain segment (i.e., these are multi-drain devices). Each drain segment is connected in series with a thin-film resistor. The channel area associated with each drain segment can be selectively removed from the circuit by cutting the connected resistor with a laser. The device's channel area (and its effective width to length ratio, Z/L) is thereby alterable. The thin film resistors are cut as the offset is measured, until an acceptably low (effectively zero) offset is obtained. This trimming operation can be performed at room temperature, and yields not only a near zero offset voltage, but also near zero drift. CMRR, further, will be maximized. Neither operating current ratio nor drain voltage need be, or is, changed.

8 Claims, 4 Drawing Sheets

SINGLE-TEMPERATURE-TRIMMABLE FET INPUT CIRCUIT HAVING ACTIVE CHANNEL SEGMENTS OF DIFFERENT AREAS

FIELD OF THE INVENTION

This invention relates to the fabrication and testing of field effect transistors, FET's (e.g. JFET's), in a manner that easily allows the channel areas of differentially connected transistors to be varied so as to minimize their offset voltage and their drift while maximizing the common mode rejection ratio.

BACKGROUND OF THE INVENTION

JFET's are popular transistors for use in high quality differential amplifiers. These differential amplifiers are frequently used as input stages in multistage differential circuits. When designing a differential amplifier, close matching of the transistors is normally sought. The critical specifications for such close matching are the offsets and drifts of each transistor relative to the other. It is industry practice that such differential transistor pairs be manufactured on the same substrate, so that they will be closely coupled thermally, but that is not sufficient to eliminate mismatch. It is also necessary that the transistors exhibit the same change of their input offset voltages with respect to temperature (i.e., drift). However, the variation of offset voltage with temperature in a JFET is both hard to predict and hard to control, because there are multiple, somewhat independent sources of offset in a differential pair of JFET's. In fact, JFET's have two independent sources of drift over temperature, $dV_p/dT$ and $dI_{ss}/dT$, where $V_p$ is the pinch-off voltage, $I_{ss}$ is the source current, and T is the temperature. This implies that there must be two degrees of freedom of adjustment to trim both offset and drift.

To these ends, it has been standard practice in the manufacture of integrated circuits to measure the offset of each JFET at room temperature, and then to heat up the die and re measure the offsets at another temperature. This data is then used to guide a laser trimming process in which (1) resistors in the drain leads of each JFET are trimmed to affect the ratio of currents in the FET's thus yielding zero voltage difference (i.e. offset voltage = ±100 mV) at room temperature and (2) resistors in the source leads of each JFET are then trimmed to an acceptable target drift as close as possible to zero (e.g., about 1 $\mu V$ per degree Celsius). Typically, successful trimming is defined as producing JFET pairs with a drift characteristic of less than 5 $\mu V$ per degree Celsius, with a 99% success rate. Unfortunately, this is a lengthy and costly procedure, since all the JFET dies or wafers have to reach temperature equilibrium at the elevated temperature before the second offset measurement can be taken.

Accordingly, it is an object of the present invention to provide a method for trimming matched FET's, in particular JFET's, that are arranged in a differential configuration, at room temperature, to minimize their offset.

A further object of the invention is to provide a method for matching the offset and offset drift of a pair of FET's (particular JFET's) at a single temperature, which maintains the match condition over a significant temperature range.

Still another object is to provide a method for matching FET offset and drift in a differential amplifier, while maximizing CMRR (common mode rejection ratio).

Yet another object of the invention is to provide a FET differential input stage wherein the FET's can be trimmed at a single temperature.

SUMMARY OF THE INVENTION

The foregoing objects are achieved by employing a method that adjusts the offset voltage of a differential pair of FET's to 0 V at room temperature, while simultaneously yielding drift rates that are very closely matched (i.e., to a drift specification of better than 5 $\mu V$ per degree Celsius) and high CMRR.

In a differential input using a quad set of devices, according to the teaching of U.S. Pat. No. 3,729,660, the channel of each transistor is formed in a piecewise, or segmented, manner. The drain and source electrodes are similarly segmented. Each drain segment is connected through a series thin film resistor to the device's drain terminal. Thus, the channel area associated with each drain segment can be selectively removed from the circuit by cutting the appropriate resistor with a laser beam. The device's channel area (and its effective width to length ratio, Z/L) is thereby alterable. The thin film resistors are cut as the offset is measured, until an acceptably low (effectively zero) offset is obtained. This trimming operation can be performed at room temperature, and yields not only a near zero offset voltage, but also near zero drift. CMRR, further, will be maximized. Neither operating current ratio nor drain voltage need be, or is, changed.

The invention will be more fully understood from the detailed description below, which is presented by way of example only, when read in conjunction with the appended claims.

DETAILED DESCRIPTION

Figure 1:
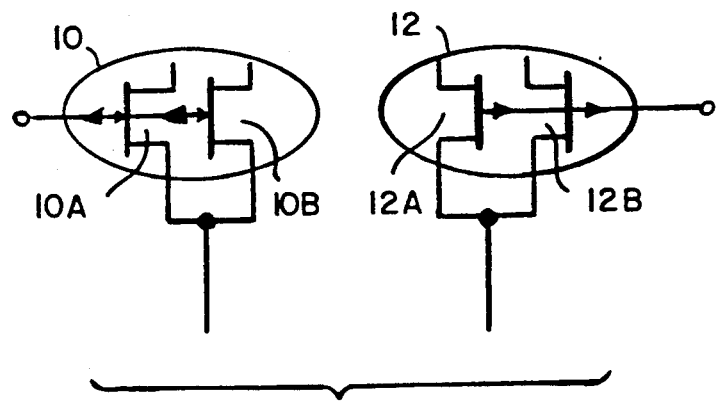
FIG. 1 is a schematic circuit diagram of the four transistors that make up typical prior art differential amplifier, or input, stage.

As stated above, a FET differential input is typically fabricated using four, not just two, transistors. FIG. 1 shows how this is done. Each active element 10 and 12 of the differential stage is typically made up of two JFET's in parallel with each other (e.g., JFETs 10A and 10B on the one hand and JFETs 12A and 12B on the other). This has become standard in the industry following U.S. Pat. No. 3,729,660, issued Apr. 24, 1973 to Modesto A. Maidique and titled "IC Device. Arranged to Minimize Thermal Feedback Effects," because it results in an averaging out of the effects of diffusion gradients. Offset trimming has traditionally been accomplished by either modifying the ratio of operating currents of the active elements or by trimming a small resistor in series with the JFETs' sources. The modification of the operating current ratio is sometimes achieved as in FIG. 2, by adding a separate differential pair 14 to inject a small current i into the source leads.

Figure 2:
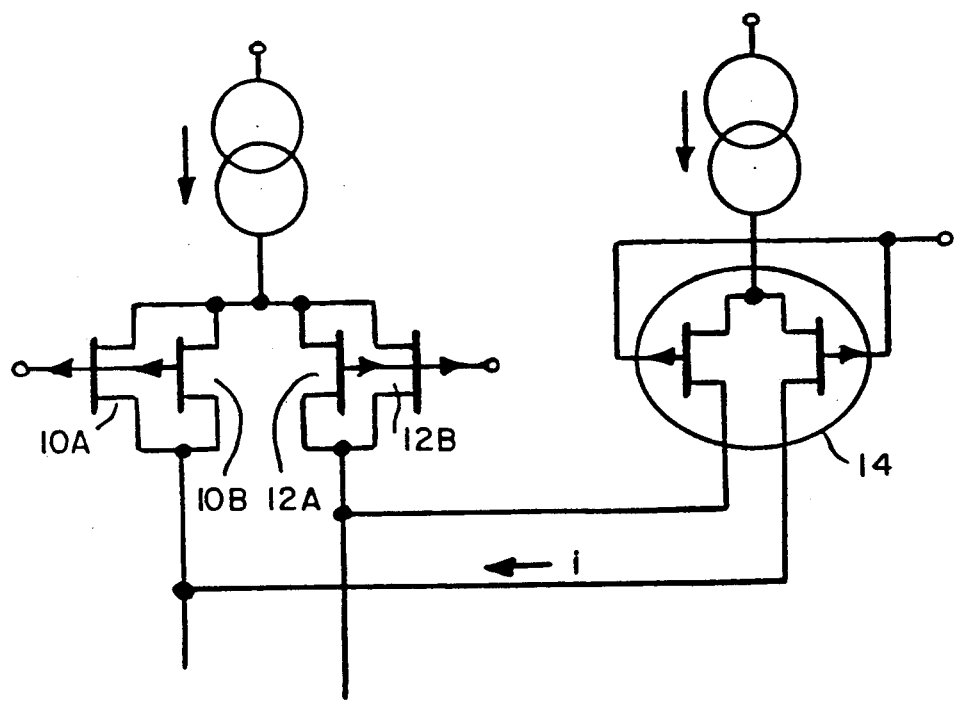
FIG. 2 is a schematic circuit diagram of another prior art approach in which the differential transistor configuration is modified by adding two other transistors in a differential pair which supplies currents to partially trim the offset voltage of the amplifier.

Even if the approach of FIG. 2 provides some lessening of offset, it does not fundamentally deal with the causes of offset and it does not minimize offset drift with temperature.

Figure 3:
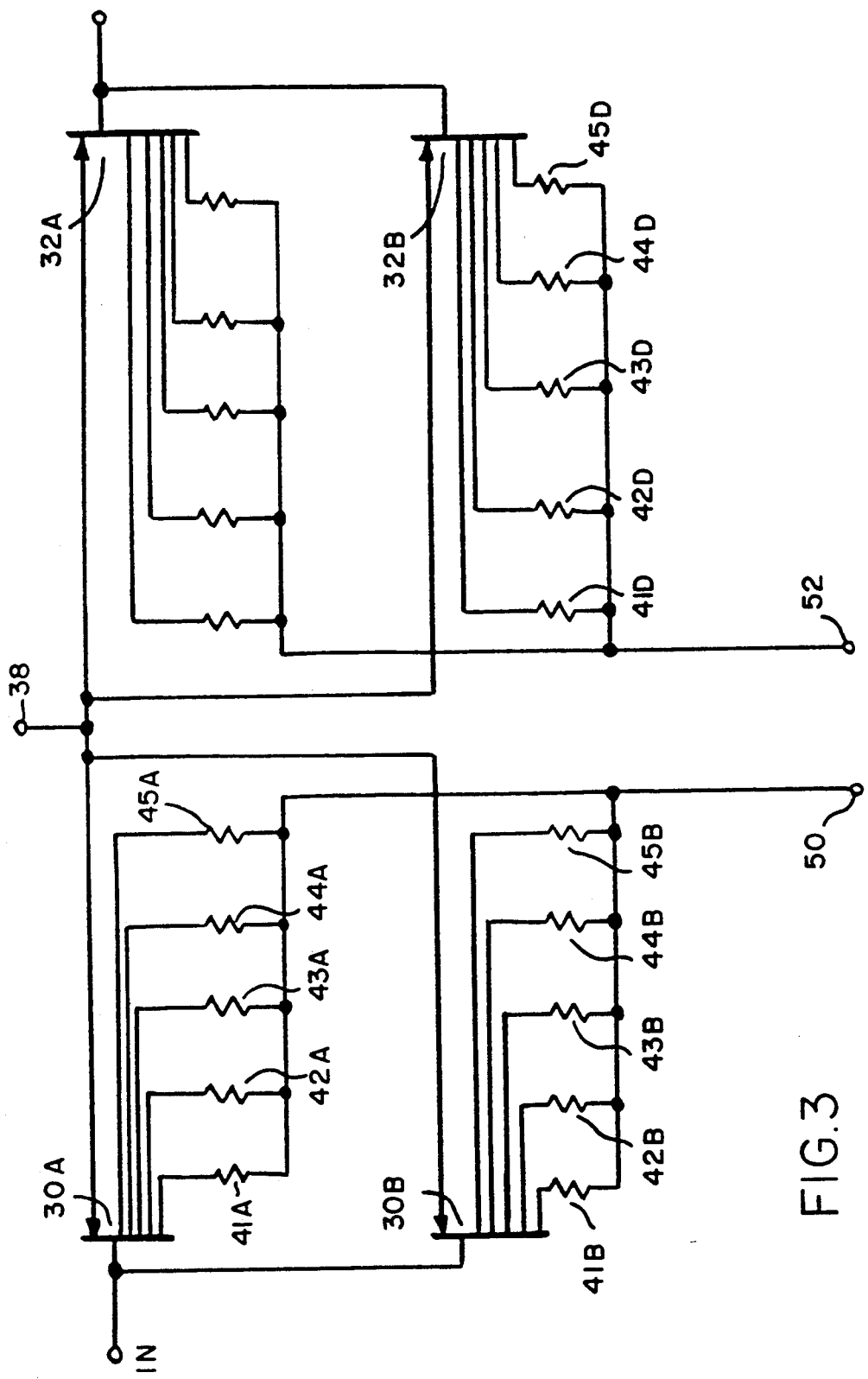
FIG. 3 is a schematic circuit diagram of the electrical connections within the four differential transistors of the present invention.

Referring to FIG. 3, the apparatus of the present invention is shown schematically. The input stage is formed of four JFET's 30A, 30B, 32A and 32B. The sources of all of the devices are tied together and to node 38. The gates of transistors 30A and 30B are connected together to a first input node NEGIN, while the gates of transistors 32A and 32B are connected together to the complementary input node POSIN. Each of FET's 30A, 30B, 32A and 32B is shown, for purposes of illustration only, as having five drains, or drain-segments, each connected to one end of a resistor, and all of the second ends of the resistors connected together to the appropriate drain terminal. For transistors 30A and 30B, this is drain terminal 50; for transistors 32A and 32B, it is drain terminal 52. For example, transistor 30A has drain segments connected to resistors 41A–45A. The distal ends of resistors 41A–45A are connected to drain terminal 50. Like connections are made for all of the other transistors.

Resistors 41A–45A, 41B–45B, 41C–45C, and 41D–45D are all thin film resistors, making them readily susceptible to laser cutting.

In the implementation illustrated in FIG. 4, which will be discussed below, each transistor is actually formed with forty channel segments. Considering FET 30A, for example, thirty-six of its drain segments are connected to resistor 45A, and one drain segment is connected to each of resistors 41A–44A. A typical value for resistor 45A is about 111 ohms; for resistors 41A–44A, 4 k ohms. The same holds true in respect of the counterparts for transistors 10B, 12A and 12B, meaning the corresponding like structures for transistors 30B, 32A, and 32B. (The resistors have different value to keep the voltages on the drain segments approximately the same; the resistor values are not critical.)

Figure 4:
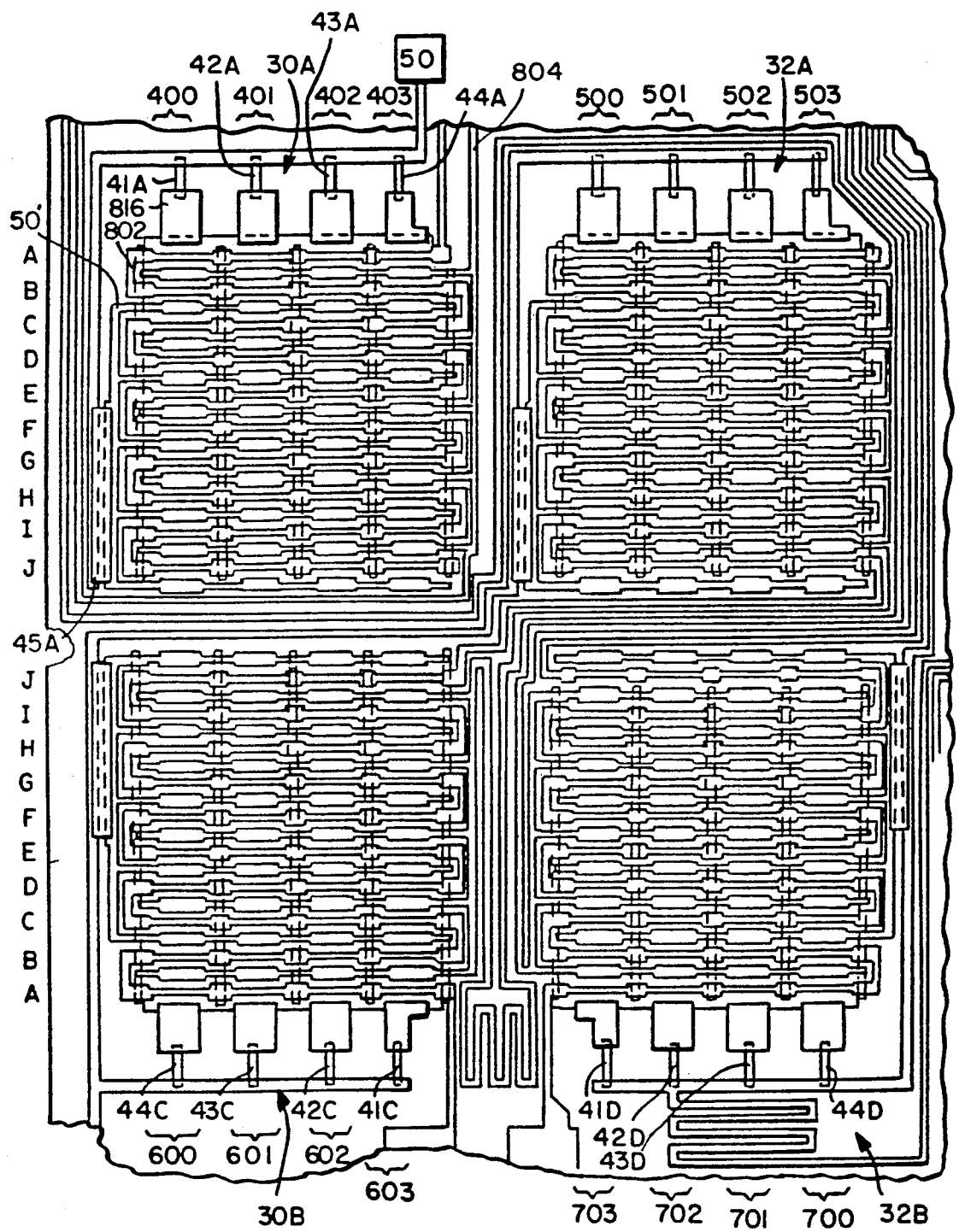
FIG. 4 is a partial composite plot of the layers of an integrated circuit implementation of the circuit of FIG. 3.

FIG. 4 shows how the transistors of this invention are mechanically laid out on a substrate, and how the drain segments are connected to the thin-film resistors. The four transistors 30A, 30B, 32A and 32B are laid out according to the teaching of the aforesaid U.S. Pat. No. 3,729,660, and are wired to be in the parallel type of differential arrangement shown in FIG. 1. The patterns for the drains of transistors 30A and 32A are identical to each other, within the precision of the mask. Similarly, the patterns for the drains of transistors 30B and 32B are identical to each other. So the parallel combination of transistors 30A and 30B is theoretically identical to the combination of transistors 32 and 32B.

To facilitate accurate trimming, the channel segments are not all made to be the same area. Thirty two of the channel segments are laid out to have the same area (i.e., 1 unit area). Four of the segments are designated as trimming pieces. For transistors 30A and 32A, the trimming pieces are used for a "coarse" adjustment; for transistors 30B and 32B, they are used for "fine" adjustment. The "coarse" trimming pieces are laid out to have channels of the following fractional unit areas:

1 X unit area (channels 400A and 500A)
$\frac{1}{2}$ X unit area (401A and 501A)
$\frac{1}{4}$ X unit area (402A and 502A)
$\frac{1}{8}$ X unit area (403A and 503A), where each channel segment is identified by a column and row location, the columns bearing three-digit numbers and the rows bearing single letter identifiers, the rows of each transistor being independently labelled. (For example, channel 401A is in column 401, row A of transistor 30A.) The four channel pieces (in each of transistors 30B and 32B) designated to be "fine" trimming pieces, have nominally the same size, but with slight positive and negative deviations from the nominal value. Specifically, transistors 30B and 32B each have four fine trim channel segments having the following fractional unit areas:

$(\frac{1}{2}+\Delta_1)$ X unit area (segments 600A, 700A)
$(\frac{1}{2}-\Delta_1)$ X unit area (segments 601A, 701A)
$(\frac{1}{2}+\Delta_2)$ X unit area (segments 602A, 702A)
$(\frac{1}{2}-\Delta_1)$ X unit area (segments 603A, 703A), where $\Delta_1$ and $\Delta_2$ are predetermined amounts which are small relative to the unit area.

To perform the fine trimming, trim segments are removed (i.e., the corresponding resistors are cut) in pairs (i.e. one segment on transistor 30B and one segment on transistor 32B); the segments to be removed will depend on the offset which is to be corrected.

Trimming of offset is accomplished at a single temperature, with the differential amplifier placed in a high gain arrangement. The trimming resistors are cut one by one until acceptably low offset values are obtained.

Figure 5:
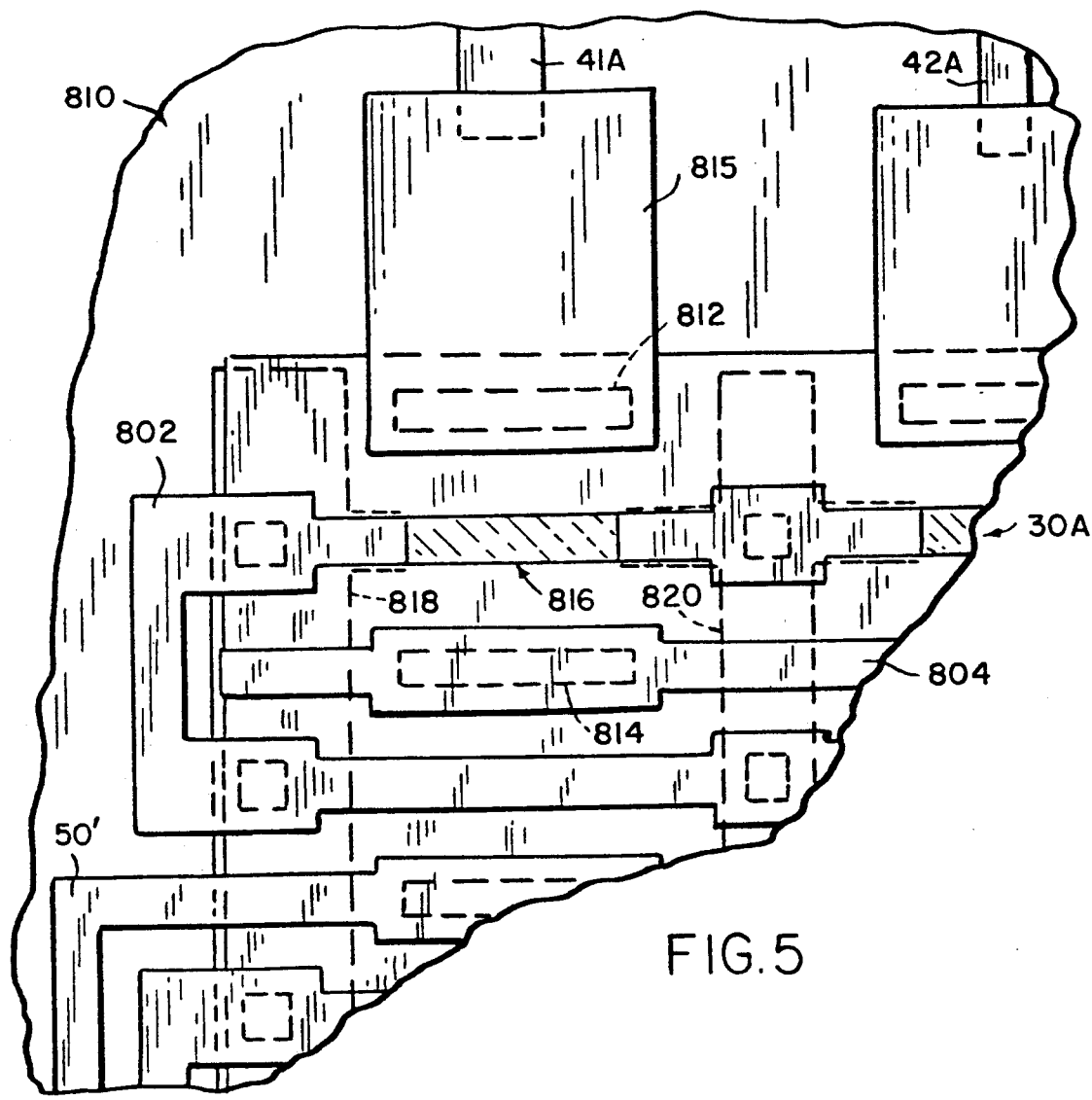
FIG. 5 is an enlarged view of a portion of a typical one of the transistors such as transistor 30A of FIG. 4.

As will be apparent from the foregoing discussion and FIG. 4, each of the four transistors 30A, 30B, 32A, and 32B is formed in a segmented fashion. Using transistor 30A as an example, the gate electrode is shown as element 802, the drain electrode, or terminal, appears as element 50, and the source metallization appears as element 804. Thus, the drain terminal 50 connects to the active portion of the semiconductor through resistors 41A–45A. For ease of identification, therefore, metallization 50 is indicated as part of the drain structure. It will thus be seen that the metallizations for the transistor electrodes are interdigitated. A portion of the structure is shown in greater detail in FIG. 5. It will be understood that, in general, the surface of the substrate 810 is covered by an oxide layer which is patterned for openings in certain locations to allow, for example, metal contacts such as drain contact 815 to connect to heavily doped portions of the substrate which form collector and drain segments. The dashed rectangles such as rectangle 812 represent the openings in the oxide. Thus, the substrate has been heavily doped beneath rectangle 812 to form a drain segment and beneath rectangle 814 to form a source segment. A channel is formed beneath gate electrode 802, in the shaded region 816. The channel is confined generally to region 816, and is bordered by regions of more heavily doped semiconductor generally represented within the dashed outlines of regions 818 and 820.

Thus, the cutting of resistors 41A–45A may be viewed either as removing from the FET or electrode terminals either corresponding drain segments or corresponding channel area.

The invention is particularly illustrated for JFET's but may be applied to other types of FET's, as well. Other obvious adaptations include substitution of fusible links (which may be electrically blown open) for laser cutting of resistors. The areas of the channels may also be modified additively, instead of subtractively. For example, the trim resistors may be replaced by zener diodes which may be "zapped", or shorted, to connect into the circuit any desired piece of channel area The coarse and fine trim segments also may be fabricated on the same transistor. Thus it will be apparent that many modifications, variations and substitutions will occur to those skilled in the art. These modifications, variations and substitutions may be made to the invention without departing from its spirit, and they are intended to be suggested by this disclosure though not expressly set forth herein. Accordingly, the foregoing detailed description should be understood not to be limiting. The invention is limited only as set forth in the appended claims.

What is claimed is:

1. A differential input stage comprising:
   a. first and second FET's, each having gate, source, and drain electrodes, and an active channel region, the gate electrodes being connected to receive, respectively, first and second differential input signals, and the source electrodes being connected together;
   b. each such active channel region being formed of multiple segments;
   c. each said drain electrode being formed of a corresponding set of drain segments, each drain segment being associated with a corresponding active channel segment;
   d. a majority of the active channel segments being of the same area, termed unit area, and a minority of the active channel segments being of different areas; and
   e. for each FET, means for selectively disconnecting at least a predetermined one of the minority of active channel segments from that FET's drain electrode without changing the drain current of the FET.

2. The input stage of claim 1 wherein the means for selectively disconnecting comprises a laser-cuttable thin-film resistor in series with the drain segment to be disconnected.

3. The input stage of claim 1 wherein for one of the FET's, the minority active channel segments include channel segments of substantially different areas, for use in coarsely trimming the channel area of said FET, and for another one of the FET's, the minority active channel segments include at least one pair of channel segments of nearly the same channel area, for use in finely trimming the channel area of said FET.

4. A method for matching first and second field-effect transistors having active channel regions in a differential amplifier, comprising:
   a. segmenting the active channel regions of each of the transistors, to create active channel region segments of at least two different areas;
   b. connecting each active channel region segment to a terminal of its transistor, via a resistor, using resistors of at least two different values within each transistor;
   c. selectively cutting with a laser one or more of the resistors within at least one of the transistors, to remove channel segments from the active channel region of the transistor, while maintaining constant current through the transistor drains, until the offset voltages of the transistors substantially match.

5. The method of claim 4 wherein the step of segmenting includes the operating of creating in at least one of the transistors selected channel segments which differ from each other in area by a predetermined amount.

6. The method of claim 5 wherein the majority of the segments area of a uniform unit area and the selected channel segments are of different area.

7. The method of claim 6 wherein a first selected channel segment is of a first area equal to a selected fraction of a unit area plus a predetermined variation and a second selected channel segment is of a second area equal to the same selected fraction of a unit area minus said predetermined variation.

8. A method for matching first and second field-effect transistors having active channel regions in a differential amplifier, comprising:
   a. segmenting the active channel regions of each of the transistors, to create active channel region segments of at least two different areas;
   b. connecting each active channel region segment to a terminal of its transistor, via a resistor, using resistors of at least two different values within each transistor;
   c. selectively cutting with a laser one or more of the resistors within at least one of the transistors, to remove channel segments from the active channel region of the transistor, while maintaining constant current through the transistor drains, until the offset voltages of the transistors substantially match.

* * * * *